United States Patent
Kwong

(10) Patent No.: US 9,718,249 B2
(45) Date of Patent: Aug. 1, 2017

(54) LAMINATED ALUMINUM OXIDE COVER COMPONENT

(71) Applicant: Apple Inc., Cupertino, CA (US)

(72) Inventor: Kelvin Kwong, San Jose, CA (US)

(73) Assignee: APPLE INC., Cupertino, CA (US)

( * ) Notice: Subject to any disclaimer, the term of this patent is extended or adjusted under 35 U.S.C. 154(b) by 354 days.

(21) Appl. No.: 13/679,493

(22) Filed: Nov. 16, 2012

(65) Prior Publication Data

US 2014/0139978 A1 May 22, 2014

(51) Int. Cl.
| | |
|---|---|
| B32B 17/00 | (2006.01) |
| B32B 7/00 | (2006.01) |
| H05K 5/03 | (2006.01) |
| B32B 3/00 | (2006.01) |
| C30B 29/20 | (2006.01) |
| C30B 33/06 | (2006.01) |
| H04M 1/02 | (2006.01) |

(52) U.S. Cl.
CPC ............. *B32B 3/00* (2013.01); *C30B 29/20* (2013.01); *C30B 33/06* (2013.01); *H04M 1/0202* (2013.01); *Y10T 428/24322* (2015.01); *Y10T 428/24331* (2015.01)

(58) Field of Classification Search
None
See application file for complete search history.

(56) References Cited

U.S. PATENT DOCUMENTS

| | | |
|---|---|---|
| 3,713,877 A | 1/1973 | Kirchner et al. |
| 3,736,171 A | 5/1973 | Kirchner |
| 3,809,574 A | 5/1974 | Duffy et al. |
| 3,859,714 A | 1/1975 | DeLuca |
| 4,043,638 A * | 8/1977 | Kaufmann ........... G04G 9/0035 349/137 |
| 4,339,300 A | 7/1982 | Noble |

(Continued)

FOREIGN PATENT DOCUMENTS

| | | |
|---|---|---|
| CN | 102400213 | 4/2012 |
| CN | 102723265 | 10/2012 |

(Continued)

OTHER PUBLICATIONS

Schmid et al. ("Effect of Crystal Orientation and Temperature on the Strength of Sapphire," Journal of the American Ceramic Society, 81, 1998, p. 885-893).*

(Continued)

*Primary Examiner* — David Sample
*Assistant Examiner* — Nicole T Gugliotta
(74) *Attorney, Agent, or Firm* — Brownstein Hyatt Farber Schreck, LLP

(57) ABSTRACT

A cover glass for an electronic display comprises a plurality of layers of sapphire material, each of the layers having a substantially single crystal plane orientation, with adjacent layers having different substantially single crystal plane orientations. One or more interface layers are defined between adjacent layers of the sapphire material, with the adjacent layers of sapphire material bonded together at the one or more interface layers. A display window is defined in the cover glass, and configured for viewing a viewable area of the electronic display through the plurality of layers of the sapphire material bonded together at the one or more interface layers.

20 Claims, 7 Drawing Sheets

(56) References Cited

U.S. PATENT DOCUMENTS

| | | |
|---|---|---|
| 4,675,089 A | 6/1987 | Lory et al. |
| 5,508,092 A | 4/1996 | Kimock et al. |
| 5,935,723 A | 8/1999 | Borden |
| 5,942,343 A | 8/1999 | Chen |
| 6,012,303 A * | 1/2000 | Axelson et al. ............ 65/36 |
| 6,440,242 B1 | 8/2002 | Fukazawa |
| 6,475,820 B2 | 11/2002 | Nakajima et al. |
| 6,528,123 B1 | 3/2003 | Cadden et al. |
| 6,627,319 B2 | 9/2003 | Jacquiod et al. |
| 6,649,494 B2 | 11/2003 | Tamura et al. |
| 6,829,270 B2 | 12/2004 | Suzuki et al. |
| 6,916,542 B2 | 7/2005 | Buhay et al. |
| 6,962,759 B2 | 11/2005 | Buhay et al. |
| 7,125,926 B2 | 10/2006 | Satoh et al. |
| 7,244,520 B2 | 7/2007 | Kumakura et al. |
| 7,311,961 B2 | 12/2007 | Finley et al. |
| 7,584,689 B2 | 9/2009 | Jones et al. |
| 7,592,629 B2 | 9/2009 | Lee et al. |
| 7,664,469 B2 | 2/2010 | Hutchison |
| 7,738,187 B2 | 6/2010 | Pazidis et al. |
| 7,793,580 B2 | 9/2010 | Jones et al. |
| 7,966,785 B2 | 6/2011 | Zadesky et al. |
| 7,998,586 B2 | 8/2011 | Lu et al. |
| 8,015,970 B2 | 9/2011 | Klun et al. |
| 8,021,758 B2 | 9/2011 | Sambasivan et al. |
| 8,025,004 B2 | 9/2011 | Jones et al. |
| 8,031,174 B2 | 10/2011 | Hamblin et al. |
| 8,055,003 B2 | 11/2011 | Mittleman et al. |
| 8,133,599 B2 | 3/2012 | Lu et al. |
| 8,450,607 B2 | 5/2013 | Du et al. |
| 8,492,292 B2 | 7/2013 | Yokota et al. |
| 8,685,490 B2 | 4/2014 | Lu et al. |
| 8,728,634 B2 | 5/2014 | Medwick et al. |
| 8,790,796 B2 | 7/2014 | Buhay et al. |
| 8,968,058 B2 | 3/2015 | Kerpich et al. |
| 8,974,924 B2 | 3/2015 | Weber |
| 9,115,030 B2 | 8/2015 | Drazenovic |
| 9,231,155 B2 | 1/2016 | Kuraoka et al. |
| 9,377,912 B2 | 6/2016 | Joyce et al. |
| 2003/0044577 A1 * | 3/2003 | Dhar et al. .............. 428/137 |
| 2003/0228476 A1 | 12/2003 | Buhay et al. |
| 2004/0040654 A1 * | 3/2004 | Masuda ............ C30B 29/20 156/308.6 |
| 2004/0102229 A1 | 5/2004 | Hutchison |
| 2006/0162849 A1 | 7/2006 | Han |
| 2007/0048526 A1 | 3/2007 | Hoffman et al. |
| 2007/0153214 A1 * | 7/2007 | Park ............ G02F 1/13394 349/155 |
| 2007/0224357 A1 | 9/2007 | Buhay et al. |
| 2008/0075941 A1 * | 3/2008 | Tatartchenko et al. ....... 428/220 |
| 2008/0139885 A1 | 6/2008 | Knapp |
| 2009/0090241 A1 | 4/2009 | Julbe et al. |
| 2009/0263651 A1 | 10/2009 | Cook |
| 2010/0027383 A1 | 2/2010 | Suzuki et al. |
| 2010/0124642 A1 | 5/2010 | Lu et al. |
| 2010/0215890 A1 * | 8/2010 | Lee et al. .............. 428/64.1 |
| 2011/0155409 A1 | 6/2011 | Du et al. |
| 2012/0048083 A1 | 3/2012 | Schwerdtfeger et al. |
| 2012/0172209 A1 | 7/2012 | Lu et al. |
| 2013/0082358 A1 | 4/2013 | Aida et al. |
| 2013/0236699 A1 * | 9/2013 | Prest et al. .............. 428/157 |
| 2013/0320823 A1 * | 12/2013 | Kiple ............ B23P 11/00 312/223.6 |
| 2013/0344321 A1 | 12/2013 | McSporran et al. |
| 2014/0087160 A1 | 3/2014 | McSporran et al. |
| 2014/0087179 A1 | 3/2014 | Takano et al. |
| 2014/0116329 A1 | 5/2014 | Chaudhari |
| 2014/0133074 A1 * | 5/2014 | Zahler ............ H04M 1/0266 361/679.01 |
| 2014/0193606 A1 | 7/2014 | Kwong |
| 2014/0272298 A1 | 9/2014 | Memering et al. |
| 2014/0349092 A1 | 11/2014 | Beckmann et al. |
| 2014/0349095 A1 | 11/2014 | Beckmann et al. |
| 2014/0355126 A1 | 12/2014 | Gutierrez et al. |
| 2015/0044447 A1 | 2/2015 | Henley |

FOREIGN PATENT DOCUMENTS

| | | | |
|---|---|---|---|
| DE | 69612997 T2 | 9/2001 | |
| DE | 112004001032 | 5/2006 | |
| JP | 02066159 | 3/1990 | |
| JP | 09008690 | 1/1997 | |
| JP | 2004085231 | 3/2004 | |
| JP | 2006275526 | 10/2006 | |
| JP | 2006276617 | 10/2006 | |
| JP | EP 1829846 A1 * | 9/2007 | ............ C04B 37/00 |
| JP | 2008-111984 A1 * | 5/2008 | ............ G06F 9/00 |
| JP | 2008111984 | 5/2008 | |
| JP | 2009204404 | 9/2009 | |
| TW | M278556 | 10/2005 | |
| TW | I261247 | 9/2006 | |
| TW | 200948734 | 12/2009 | |
| TW | 201111527 | 4/2011 | |
| TW | M438642 | 10/2012 | |
| WO | WO97/20963 | 6/1997 | |
| WO | WO02/054718 | 7/2002 | |
| WO | WO2009/025842 | 2/2009 | |
| WO | WO 2009/151160 A1 * | 12/2009 | ............ C30B 29/20 |
| WO | WO2012/088209 | 6/2012 | |
| WO | WO2013/134159 | 9/2013 | |
| WO | WO2014/126777 | 9/2014 | |

OTHER PUBLICATIONS

Juropol's 2" Sapphire Crystal Ingot Specification (2014): http://www.juropol.eu/_files/pdf/2_inchIngot_Specification_Juropol.pdf.*

Chaudhari, P. et al., Heteroepitaxial Silicon Film Growth at 600C From an Al—Si Eutectic Melt, pp. 5368-5371, Mar. 19, 2010, Thin Solid Films 518, Elsevier, US.

Barbour JD et al., "The mechanical properties of alumina films formed by plasma deposition and by ion irradiation of sapphire," Nuclear Instruments & Methods in Physics Research, Section—B:Beam Interactions with Materials and Atoms, Elsevier, Amsterdam, NL, vol. 166-167, May 1, 2000, pp. 140-147.

Feng et al., "Strengthening sapphire at elevated temperatures b SiO2 films," Applied Surface Science, Elsevier, Amsterdam, NL, vol. 253, No. 12, Mar. 13, 2007, pp. 5365-5367.

Kirkpatrick A et al., "Effect of Ion Implantation on the Strength of Sapphire at 300-600° C.," Journal of Materials Science, Kluwer Academic Publishers, Dordrecht, vol. 36, No. 9, May 1, 2001, pp. 2195-2201.

Klein, Claude et al., "Flexural strength of sapphire: Weibull statistical analysis of stressed area, surface coating, and polishing procedure effects," Journal of Applied Physics, American Institute of Physics, vol. 96, No. 6, Jan. 1, 2004, 8 pages.

Kobrin, P.H. et al., "Compressive thin films for increased fracture toughness," Proceedings of SPIE, vol. 683, Jan. 1, 1986-Aug. 19, 1986, 5 pages.

Liu, C.M. et al., "The effect of annealing, precipitation-strengthening, and compressive coating processes on sapphire strength," Materials Science and Engineering A: Structural Materials: Properties, Microstructure & Processing, Lausanne, Switzerland, vol. 420, No. 1-2, Mar. 25, 2006, 8 pages.

Patscheider, Jorg et al., "Plasma-Induced Deposition of Thin Films of Aluminum Oxide," Plasma Chemistry and Plasma Processing, Plenum Press, New York, US, vol. 12, No. 2, Jun. 1, 1992, 17 pages.

Seman, Michael T. et al., "An Analysis of the Deposition Mechanisms involved during Self-Limiting Growth of Aluminum Oxide by Pulsed PEVCD," Chemical Vapor Deposition, Wiley-VCH Verlag, Weinheim, Germany, vol. 14, No. 9/10, Sep. 1, 2008, 7 pages.

Simpson, Todd W. et al., "Kinetics of the Amorphous → γ → α Transformations in Aluminum Oxide: Effect of Crystallographic Orientation," Journal of the American Ceramic Society, vol. 81, No. 1, Jan. 1, 1998, 6 pages.

International Search Report and Written Opinion, PCT Application No. PCT/EP2014/054819, 12 pages, Apr. 30, 2014.

International Search Report and Written Opinion, PCT Application No. PCT/EP2014/054820, 11 pages, Apr. 30, 2014.

(56) References Cited

OTHER PUBLICATIONS

International Search Report and Written Opinion, PCT Application No. PCT/US2013/060989, 10 pages, Feb. 5, 2014.
International Search Report and Written Opinion, PCT Application No. PCT/US2013/066193, 11 pages, Jan. 20, 2014.
International Search Report and Written Opinion, PCT Application No. PCT/US2014/029026, 15 pages, Jul. 30, 2014.
U.S. Appl. No. 14/033,890, filed Sep. 23, 2013, Douglas Weber et al.
U.S. Appl. No. 14/214,163, filed Mar. 14, 2014, Memering et al.
U.S. Appl. No. 14/453,065, filed Aug. 6, 2014, Beckmann et al.
U.S. Appl. No. 14/453,102, filed Aug. 6, 2014, Beckmann et al.
Morris, Jr., J.L., "A Survey of Materials Science I. Structure," Chapter 4, pp. 79-109, Fall 2007.

* cited by examiner

LAMINATED ALUMINUM OXIDE COVER COMPONENT

TECHNICAL FIELD

This subject matter of this disclosure relates generally to display and cover glass components for electronic devices. In particular, the disclosure relates to laminated materials suitable for use in display and cover glass components for electronic devices, including, but not limited to, cellular phones, tablet computers, personal computers, personal digital assistants, media players, and other stationary and portable electronic devices.

BACKGROUND

Electronic devices generally include a variety of different display and cover components, including front and back glasses (or cover glasses), display windows, touch screens, track pads, camera and lens covers, and other internal and external cover components where optical features, durability and reliability are design issues. In use, these components are subject to a wide range of different environmental effects, including physical and electrical contact, temperature extremes, scratching, and impact.

These effects raise a number of design issues, particularly where internal and external components are subject to different combinations of environmental conditions and performance requirements. Associated design and engineering considerations include tradeoffs between shock and impact resistance, machinability, temperature stability, and thermal and electromagnetic properties including resistance, conductance, and permeability.

SUMMARY

This disclosure relates to cover glass and display components for electronic devices, methods of making the cover glass, and electronic devices incorporating the cover glass and display components. In various examples and embodiments, the cover glass includes a plurality of layers of substantially single-crystal sapphire, each of the layers having a substantially single crystal plane orientation, with adjacent layers having different orientations. One or more interface layers are defined between adjacent sapphire layers, bonding the layers together. A display window is defined in the cover glass, and configured for viewing the electronic display through the sapphire and interface layers.

Depending on configuration, the adjacent layers of substantially single crystal sapphire may have substantially orthogonal crystal plane orientations, for example alternating A and C plane orientations defined substantially along the one or more interface layers. One or more of the sapphire layers may also include a metal component selected for physical properties including color, hardness, thermal or electrical conductivity and resistivity, and magnetic permeability.

The cover glass may include a display window layer comprising substantially opaque border portions and a substantially transparent window portion configured to define the display window in the cover glass. The display window layer can be provided between two of the layers of substantially single-crystal sapphire material, or in a top or bottom layer of the cover glass.

The one or more interface layers may define adhesive bonds or hydrogen bonds between the adjacent sapphire layers. Alternatively, the one or more interface layers may be fused together across the one or more interface layers, for example by fusing a polycrystalline or amorphous aluminum oxide material between the adjacent sapphire layers. Depending on manufacturing method, the cover glass can be formed by compressively loading the adjacent sapphire layers during thermal fusion, for example at a fusion temperature between about 2000° C. and about 2100° C.

In additional configurations, an electronic device includes a display, a frame disposed about the display, a back cover coupled to a back of the frame and positioned behind the display, and a front glass coupled to a front of the frame and positioned in front of the display. The front glass is formed by bonding together a plurality of sapphire layers having substantially single crystal plane orientations, where the crystal plane orientations of adjacent layers are different.

A substantially transparent display window is defined in the front glass, and configured for viewing the display through the plurality of sapphire layers. For example, the device may include a display layer disposed between two of the sapphire layers, where the display layer includes substantially opaque side portions and a substantially transparent window portion to define the display window in the front glass.

One or more interface layers may be defined between the adjacent sapphire layers, for example with the sapphire layers bonded together across the interface layers, or with adjacent sapphire layers having substantially orthogonal crystal plane orientations along the interface layers. The interface layers may also include a polycrystalline or substantially amorphous aluminum oxide material fused between the adjacent sapphire layers, or hydrogen bonds between the adjacent sapphire layers.

The back cover of the device can also be formed by bonding two or more substantially single crystal sapphire layers together along an interface. The interface defines a transition between different crystal plane orientations in the two or more sapphire layers.

Alternatively, a cover glass for an electronic device with a display may include at least first and second sapphire layers having first and second substantially orthogonal single crystal plane orientations, bonded together across an interface layer. A display window can be defined in the cover glass, configured for viewing the display through the first and second sapphire layers bonded together across the transition layer.

Depending on application, the interface layer may define a fusion bond between the first and second sapphire layers. A display window layer may be provided adjacent the second sapphire layer, with substantially opaque side regions and a substantially transparent window region configured for a viewing the display through the cover glass.

The cover glass can include a third sapphire layer adjacent the display window layer, opposite the second sapphire layer, so that the display window layer is between the second and third sapphire layers. The first, second and third sapphire layers may each have a thickness of about 0.2 mm to about 0.4 mm, with a cover glass thickness of 1.0 mm or less.

DETAILED DESCRIPTION

Figure 1A:
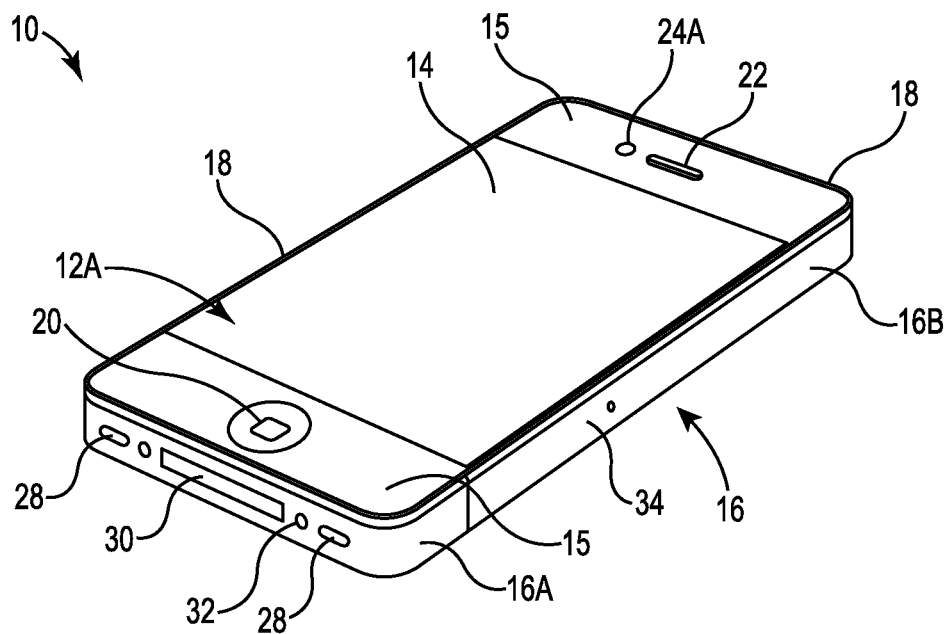
FIG. 1A is a perspective view of an electronic device in a communications embodiment, showing the front cover glass.
Figure 1B:
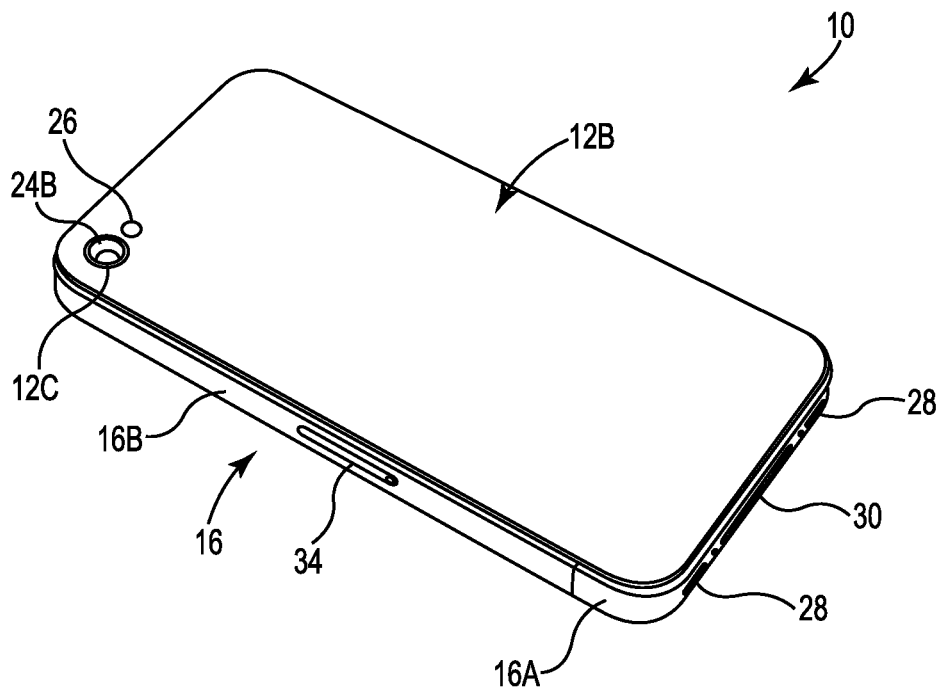
FIG. 1B is an alternate perspective view of the device, showing the back cover glass.

FIG. 1A is a perspective view of electronic device 10 in a communications embodiment, for example a portable phone or digital assistant, showing front cover (or cover glass) 12A. FIG. 1B is an alternate perspective view of device 10, showing rear cover (or cover glass) 12B.

As shown in FIGS. 1A and 1B, device 10 includes front cover or cover glass 12A with display window 14, back cover or cover glass 12B, and housing 16. These components of device 10 may also be configured for a range of different electronics applications, including not only portable phones, digital assistants and other communications devices, as illustrated in FIGS. 1A and 1B, but also personal computers, tablet computers, computer displays, media players, and other portable and stationary electronic devices.

In this particular configuration, front cover glass 12A and rear cover glass 12B are coupled to housing 16 using a bezel or frame assembly 18. One or both of front and rear cover glasses 12A and 12B incorporate a laminated aluminum oxide, sapphire crystal, or sapphire glass material, providing a range of different performance features including scratch and impact resistance, durability, and increased surface hardness, as described below.

Display window 14 is configured for viewing a display through front cover glass 12A, for example as defined between top and bottom (or side) border regions 15. Depending on configuration, display window 14 may also accommodate one or more interactive control features, for example an internal or external touch screen or touch-sensitive display, with capacitive or resistive coupling across the front surface of cover glass 12A.

Cover glasses 12A and 12B may also include or accommodate additional features, including, but not limited to, additional control features 20 (e.g., a home button or other control device), audio features 22 (e.g., a speaker or microphone), sensors 24A and 24B (e.g., cameras or infrared sensors), and lighting or indicator features 26 (e.g., a flash unit, light emitting diode or other indicator, display or illumination device). Depending on design requirements, additional cover glass components may be provided for one or more of these features, for example a separate lens cover glass element 12C for camera 24B, as provided within back cover glass 12B.

Housing 16 and frame 18 are typically formed of durable polymer, composite, or metal materials, for example a metal or metal alloy such as aluminum or stainless steel, or a durable plastic or composite material. Housing 16 and frame 18 may also be provided as substantially unitary or discrete components, for example bottom housing 16A and top housing 16B in combination with a unitary bezel or frame assembly 18, or in other configurations, as described below.

Housing 16 and frame 18 may also be configured to accommodate additional accessory features, including, but not limited to, additional speaker or microphone apertures 28, one or more connector apertures 30 for power, audio (e.g. earphone), and control connections, mechanical fasteners or coupling points 32, and one or more access ports 34 (e.g, for a subscriber identity module, flash memory device, or other internal component). These features may be variously arranged on front and back covers 12A and 12B, and on the individual components of housing 16, for example along bottom housing 16A or top housing 16B, or on discrete side housing or back cover structures, as described below.

Figure 2A:
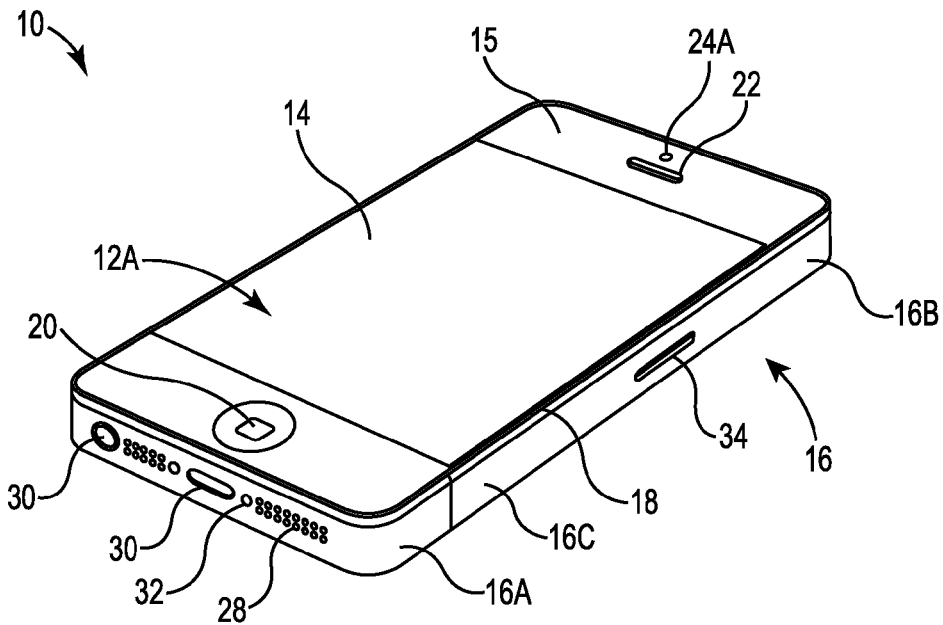
FIG. 2A is a perspective view of the electronic device in an alternate configuration, showing the front glass.
Figure 2B:
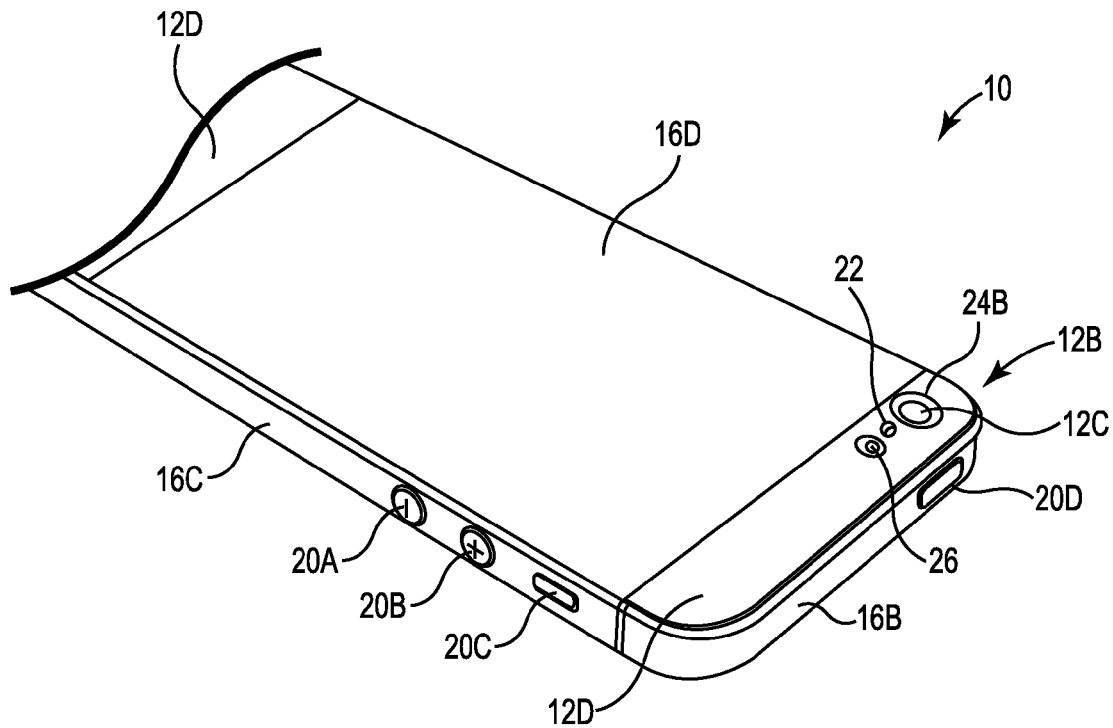
FIG. 2B is a rear view of the electronic device, showing the back cover.

FIG. 2A is a perspective view of electronic device 10 in an alternate configuration, for example an advanced portable device or smart phone, showing front glass 12A with display window 14. FIG. 2B is an rear view of device 10, showing back glass 12B provided as one or more discrete inlays or inset components 12D, with or without a separate cover glass element 12C for sensor elements such as back camera 24B.

As shown in FIGS. 2A and 2B, device 10 is adaptable to a range of different front and back cover glass and housing configurations. In this particular embodiment, for example, housing 16 includes bottom housing 16A and top housing 16B in a beveled configuration, with beveled side housing sections 16C coupled across middle plate 16D, forming the back surface of device 10 between back glass components 12D.

Front and back glass components 12A and 12B (or 12D) also accommodate range of different arrangements and configurations for display window 14, accessory and control features 20, audio features 22, camera or sensor features 24A and 24B, and lighting or indicator features 26, as shown in FIGS. 2A and 2B. Device 10 may also include additional control or accessory features, for example one or more volume, ringer, mute, or hold buttons or switches 20A, 20B and 20C, 20D, for examples as provided in bottom housing 16A, top housing 16B, or side housing 16C, one or more of cover glass components 12A, 12B, and 12D, or a combination thereof.

Figure 3A:
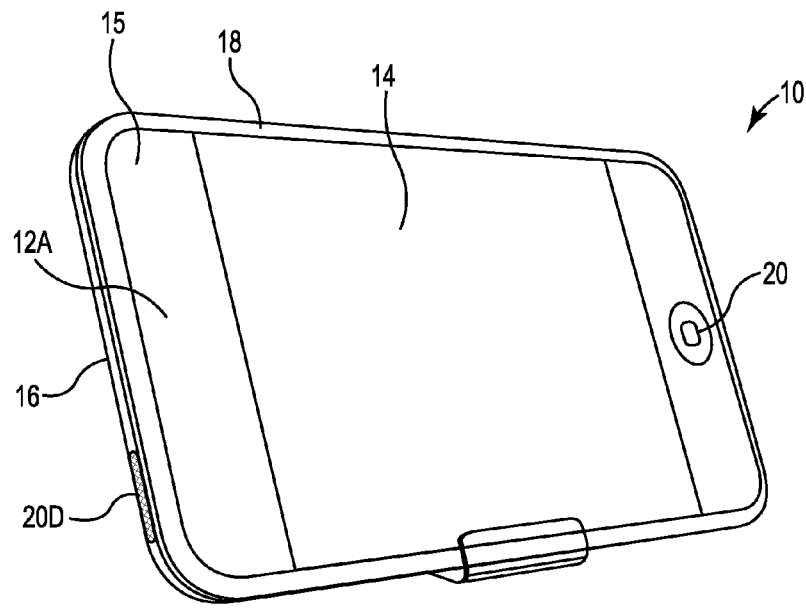
FIG. 3A is a front perspective view of the electronic device in a media player embodiment, showing the display window.

FIG. 3A is a front perspective view of electronic device 10, in a media player embodiment, showing display window 14 in front glass 12B. As illustrated in FIG. 3A, the various horizontal and vertical orientations of device 10 are arbitrary, and designations of the various top, bottom, and side components may be interchanged without loss of generality.

As shown in FIG. 3A, housing 16 may have a substantially unitary configuration, for example with housing 16 formed together with the back cover of device 10. Front glass 12A may be also attached to housing 16 via adhesive coupling to frame 18, and one or both of housing 16 and frame 18 may be formed of a plastic or other durable polymer material rather than metal, or using a combination of metal, polymer or plastic, and composite materials.

Figure 3B:
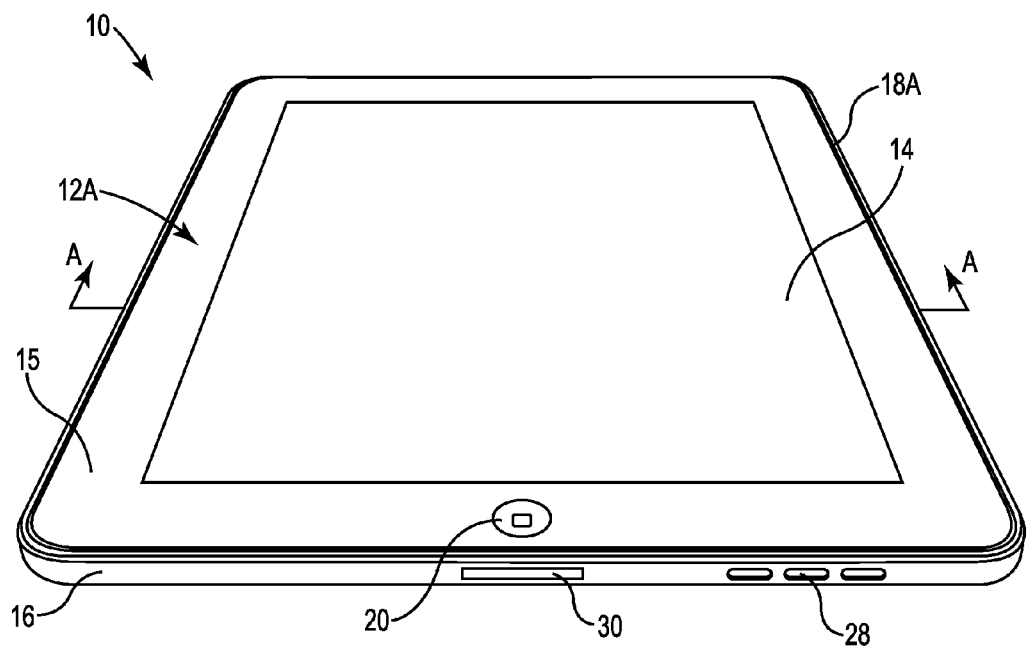
FIG. 3B is a front perspective view of the electronic device in a tablet computer embodiment.

FIG. 3B is a front perspective view of electronic device 10, in a computer embodiment, for example a tablet computer, pad computer, or other computing device, or a computer monitor or display. Front glass 12 can be configured to accommodate display window 14, a hold button or other control feature 20, and one or more other accessory features, provided in a variety of different arrangements as described above. As shown in FIG. 3B, housing 16 may also be coupled to front glass 12A with a substantially internal frame assembly 18, as described above, or via a bezel or groove arrangement 18A formed into housing 16, or using a combination of the two.

Figure 4:
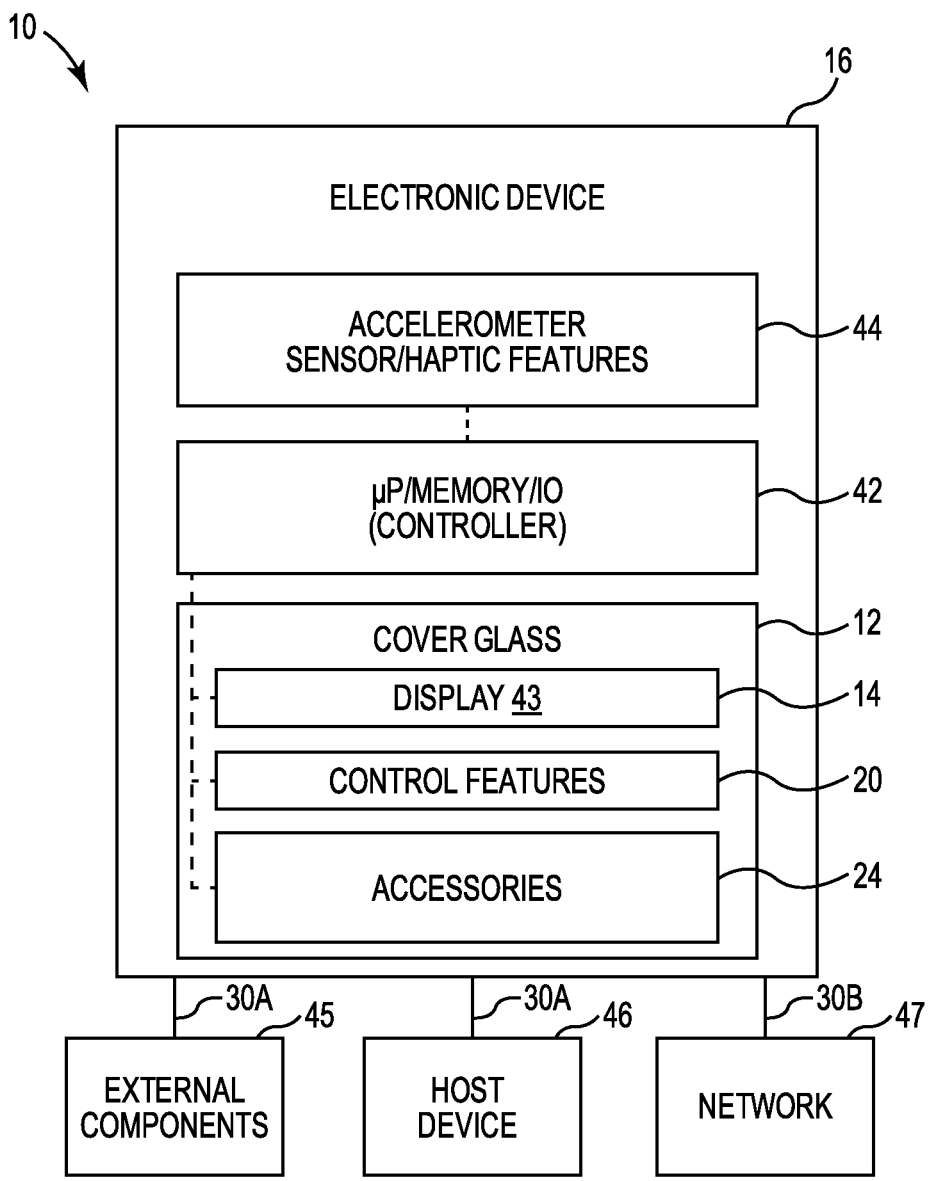
FIG. 4 is a block diagram illustrating internal and external components of the electronic device.

FIG. 4 is a block diagram of electronic device 10, illustrating internal and external components. Device 10 encompasses a range of different portable and stationary electronics applications for cover glass 12, as described above, including hybrid devices such as a mobile telephone and computing devices with media player capabilities, remote controls and game players, global positioning and telecommunications devices, and laptop, desktop, notebook, handheld or ultraportable computer and monitor display devices.

Cover glass 12 incorporates a laminated sapphire, crystalline aluminum oxide or sapphire glass construction, as configured for improved hardness, durability, impact and scratch resistance or other performance features selected for the particular characteristics of electronic device 10. Particular examples of cover glass 12 include, but are not limited to, front glass 12A, back glass 12B, specialty (e.g., camera or lens) cover glass 12C, or a glass insert, inset or inlay element 12D, as described above.

Depending on embodiment, cover glass 12 may include display window 14 and one or more additional control features 20, including button-type control features 20 as well as volume, ringer, and hold switches, buttons and other control features 20A, 20B, 20C, or 20D, and additional accessory features 24 including cameras (e.g., camera features 24A or 24B). Accessories 24 may also include audio features (e.g., microphone or speaker features 22 and 28), and audio/visual features (e.g., flash or indicator/display features 26).

Device 10 may also include a range of different internal components, for example a controller 42 including a microprocessor (μp), memory, and one or more input/output (IO) and interface components. Controller 42 is coupled to display 43, as provided within display window 14 of cover glass 12.

Additional sensor and internal accessory components 44 may also be provided, for example an accelerometer or motion sensor, or a haptic feedback device such as a vibration motor or actuator. External connections can be made to additional components via hard-wired connectors 30A or wireless connections 30B, including, but not limited to, headphones, speakers, displays and other external components 45. Device 10 may also be connected to a host device 46 and one or more networks 47, for example a wireless communications network, a local area network, or the internet.

Processor, memory, and input-output (or control) components 42 are configured to operate electronic device 10 and communicate with external components 45, 46, and 47. Control components 10 may execute operating system and application software to provide a range of functions including, but not limited to, voice communications, internet browsing, messaging, email, media playback and development, gaming, security, transactions, navigation, and scheduling, reminders, alarms, and other personal digital assistant and portable or fixed electronics device functions. Control components 10 also include communications interface and other input-output (IO) elements to support hard-wired, audio (e.g., voice control), and wireless communications, including infrared (IR), visual, and radio frequency (RF) communications.

Figure 5:
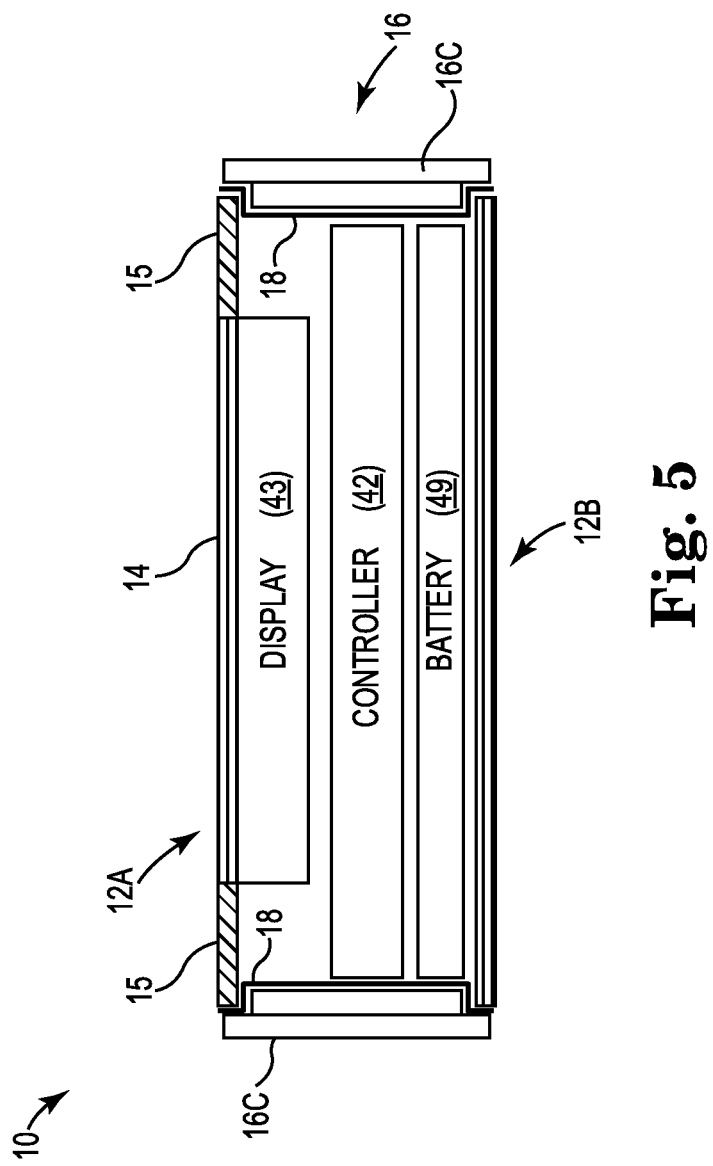
FIG. 5 is a cross-sectional view of the electronic device, taken along line A-A of FIG. 3B.

FIG. 5 is a cross-sectional view of electronic device 10, for example as taken along line A-A of FIG. 3B, or for any of the other devices 10 as shown in FIGS. 1A, 1B, 2A, 2B, 3A, and 4. In the particular configuration of FIG. 5, device 10 comprises front glass 12A, back glass 12B, housing 16 with side housings 16C, and frame 18. Internal components of device 10 include controller 42, display 43 and battery or other power source 49.

Front glass 12A and back glass 12B are coupled to side housings 16C via mechanical attachment to frame 18. Controller 42, display 43 and battery 49 are disposed within housing 16 and frame 18, with frame 18 disposed about the periphery of display 43. Front glass 12A is coupled to the back (or bottom) portion of frame 18, and positioned behind (or below) display 43. Front cover glass 12A is coupled to the front (or top) portion of frame 18, and positioned in front of (or above) display 43.

One or both of front glass 12A and back glass 12B are formed of a plurality of substantially single crystal sapphire layers, each having a substantially single crystal plane orientation. The sapphire layers are bonded together to form front glass 12A or back glass 12B, or both. The substantially single crystal plane orientations of adjacent sapphire layers are different, in order to provide improved stress and strain characteristics as described below.

Display window 14 is defined in front glass 12A, and configured for viewing display 43. Typically, display window 14 is provided as a substantially transparent feature, in order to observe a viewable area of display 43 through the layers of front glass 12A. Substantially opaque side or border portions 15 may also be provided, in order to define the boundaries of transparent display window 14. Back glass 12B may be substantially opaque or transparent, and may also include one or more display windows 14, for example to view an additional back-side display or indicator, or another internal component of electronic device 10.

Figure 6A:
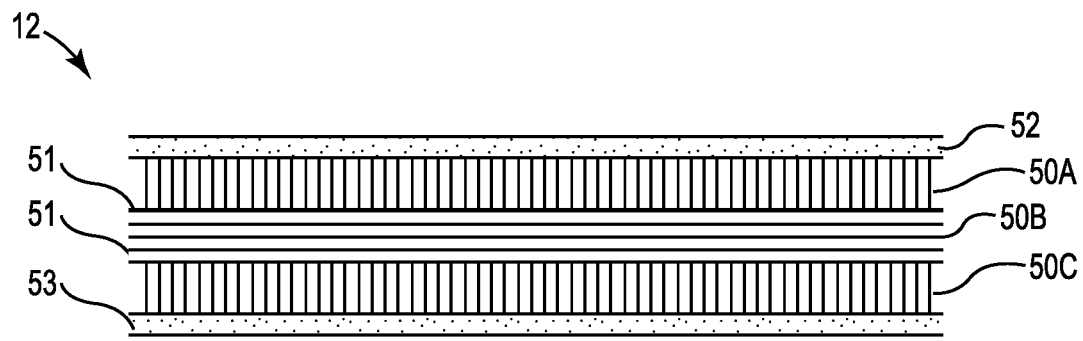
FIG. 6A is a cross-sectional view of a representative cover glass for the electronic device, illustrating the laminar structure.

FIG. 6A is a cross-sectional view of cover glass 12 for an electronic device, illustrating a laminar single-crystal layer structure, for example with one, two, three or more single-crystal layers 50A, 50B, and 50C, bonded together at interface layers 51. Additional surface coatings 52 and 53 may also be provided, for example one or more of an optical coating, a scratch or abrasion coating, an anti-reflection or anti-glare coating, a photochromatic coating, a pigmented coating, and an olephobic or other moisture or oil-resistant coating.

In the particular example of FIG. 6A, layers 50A, 50B, and 50C of cover glass 12 are formed of an aluminum oxide, sapphire, or sapphire glass material, where each layer 50A-50C has a substantially single-crystal configuration, bonded together by fusion, adhesion, or other bonding process across interface layers 51. The substantially single crystal plane orientations of each individual layer 50A, 50B, and 50C vary, with different plane orientations selected in adjacent sapphire layers for a combination of strength, hardness, durability, scratch resistance, and ability to withstand shock, impact, thermal variation, and other stress and strain effects.

As used herein, the term "sapphire glass" encompasses sapphire and aluminum oxide materials in substantially single-crystal or polycrystalline form, for example corundum, sapphire, or ruby, and in fused polycrystalline or amorphous forms. Similarly, the terms "glass" and "cover glass" encompass single-crystal, polycrystalline, fused polycrystalline and amorphous sapphire, corundum and aluminum oxide materials, and components made from these materials.

In particular, the term "glass" as used herein is not limited to amorphous forms, for example amorphous silica glass. This reflects usage in the art, and in this disclosure, where cover glasses, front glasses, back glasses, glass inlays, glass insets, glass inserts, and other glass components may be described as glass elements or glass components, whether provided in amorphous, polycrystalline, fused polycrystalline, or substantially crystalline form, and whether formed of aluminum oxide and sapphire materials, as described herein, or whether formed of silica glass, lead crystal, quartz, or other materials, as known in the art.

In general, sapphire, sapphire glass, and aluminum oxide materials provide layers 50A, 50B, and 50C with increased hardness and strength, as compared to other glass materials including silica glass. In addition, the different crystal plane orientations of individual sapphire layers 50A, 50B, and 50C provide particular combinations of stress and strain resistance, depending on the crystal plane orientations of adjacent layers 50A, 50B, and 50C.

Substantially single-crystal sapphire layers 50A-50C are formed by sintering and fusing aluminum oxide (alumina; $Al_2O_3$ or $\alpha$-$Al_2O_3$) in an inert atmosphere to produce a single crystal (or substantially single crystal) sapphire or corundum boule. Typical synthesis processes include, but are not limited to, Verneuil processes, Czochralski processes, and flux methods. The sapphire boules are then cut (e.g., using industrial diamond saws) to produce single-crystal sheets or blanks, with individual layer thickness from about 0.2 mm to about 1.0 mm, for example about 0.2 mm-0.4 mm or about 0.3 mm, or about 0.3-0.5 mm, about 0.4 mm-0.6 mm, or about 0.5 mm-1.0 mm.

Two, three, four or more individual single-crystal sapphire layers 50A-50C may be bonded together by fusion processes to form cover glass 12, for example by heating with individual layers 50A-50C under compressive load. The melting point of sapphire is approximately 2030-2050° C., and suitable bonding temperatures may range from about 2000° C. to about 2100° C., depending on loading properties and desired fusion time and bond configuration.

In fused embodiments of cover glass 12, interface layer 51 may be formed as a substantially amorphous or polycrystalline sapphire glass or aluminum oxide layer, as defined between adjacent substantially single-crystal layers 50A, 50B, and 50C. For example, interface layer 51 may be formed by providing a polycrystalline or amorphous aluminum oxide material between two adjacent substantially single-crystal sapphire layers 50A-50C, and bonding the adjacent substantially single-crystal sapphire layers together across interface layer 51 by thermal fusion. Alternatively, interface layer 51 may be formed by thermal fusion of adjacent substantially single-crystal sapphire layers 50A-50C, without the addition of additional aluminum oxide or other materials.

In additional examples, hydrophilic (OH) surfaces may be formed on adjacent single-crystal layers 50A-50C, in order to provide hydrogen bonding along interface layers 51. Interface layers 51 can also be formed as adhesive bonded layers, for example using a polymer binder or other adhesive material, or as an optical coating, pigment, or other surface coating, as described above. Alternatively, adjacent layers 50A, 50B, and 50C may be bonded by a cold working process layer 51, or layers 50A, 50B, and 50C may be maintained in an adjacent relationship by mechanical coupling along interfaces 51, for example a compressive coupling along the edges of cover glass 12.

Figure 6B:
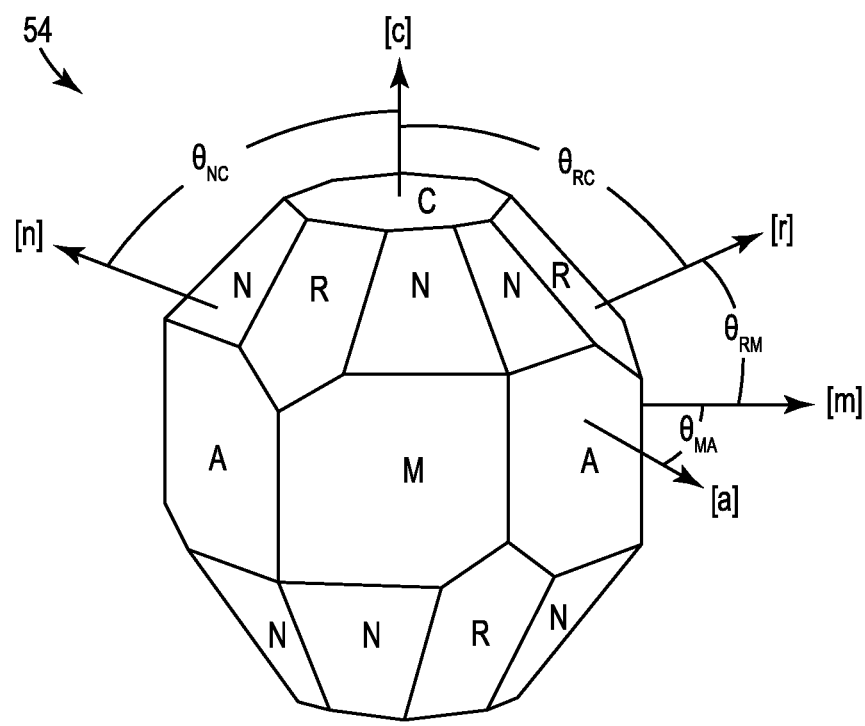
FIG. 6B is a schematic view of representative crystal plane orientations for the layers of the laminar cover glass.

FIG. 6B is a schematic diagram illustrating the crystal plane orientation of aluminum oxide (sapphire or corundum) crystal 54, for example in a substantially single-crystal sapphire or ruby embodiment. As shown in FIG. 6B, sapphire 54 exhibits a multi-faceted (e.g., rhombohedral) crystal structure, with individual crystal planes oriented at different relative angles, including, but not limited to, crystal planes N, C, R, A, and M, respectively.

The angular orientations of the different crystal planes may be defined in terms of perpendicular vectors, for example angle $\theta_{NC}$ of about 61° between perpendiculars [n] and [c] to planes N and C, and angle $\theta_{CR}$ of about 57.6° between perpendiculars [c] and [r] to planes C and R, respectively. Additional planar orientations are also shown in FIG. 6B, including angle $\theta_{RM}$ of about 32.4° between perpendiculars [r] and [m] to planes R and M, and angle $\theta_{MA}$ of about 30° between perpendiculars [m] and [a] to planes M and A, respectively. Some planes have substantially perpendicular orientations, for example planes A and C and planes M and C, but the relationship is not necessarily mutual or transitive; that is, plane A is perpendicular to plane C, and plane C is perpendicular to plane M, but plane M is not perpendicular to plane A, as shown in FIG. 6B.

In assembling laminar cover glass 12, different crystal planes N, C, R, A, and M (and other planar orientations) are selected for stress and strain properties, inherent strength, and scratch, impact and shock resistance. In one particular application, for example, cover glass 12 may incorporate alternating substantially single-crystal A and C (or C and A) planes, oriented along the substantially parallel surfaces of sapphire layers 50A, 50B, and 50C, respectively. In this embodiment, crystal planes A and C may be selected not only for inherent planar strength, but also based on the resulting perpendicular crystal plane structures, as defined at or across interface layers 51.

Alternating M and C planes may also be utilized, or any combination of A, M, and C, planes, where inherent planar strength varies but each interface 51 is formed at a perpendicular crystal plane interface 51. In additional examples, any other combination of crystal plane orientations N, C, R, A, and M may be used for layers 50A-50C, in any order, with a variety of different perpendicular and skew crystal plane intersections defined along interface layers 51.

Figure 7A:
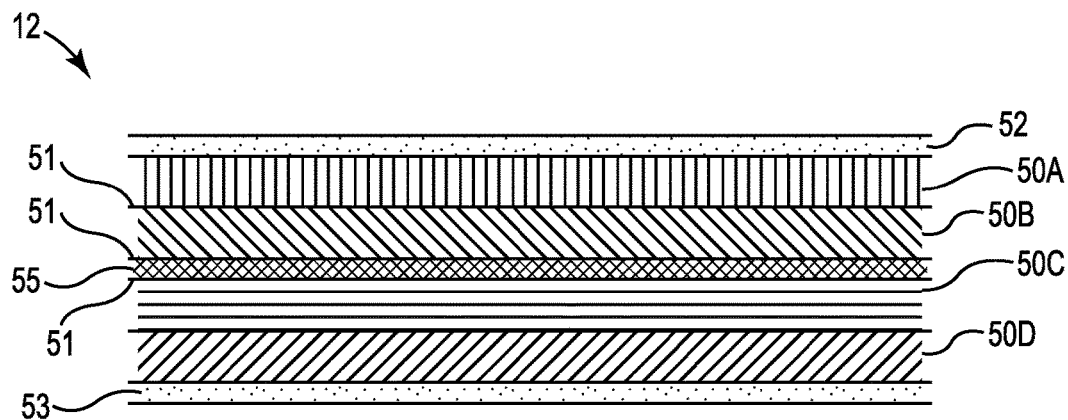
FIG. 7A is a cross-sectional view of the cover glass, illustrating a first alternate laminar structure.

FIG. 7A is a cross-sectional view of cover glass 12, illustrating an alternate laminar structure. In this configuration, cover glass 12 is formed of four or more substantially single-crystal sapphire or aluminum oxides layers 50A-50D, with different crystal plane structures for improved strength, impact and scratch resistance, and selected stress and strain properties, as described above.

Individual single-crystal sapphire layers 50A-50D may be fusion bonded, adhesive bonded, or mechanically bonded to form cover glass 12, as described above. Correspondingly, interface layers 51 may be formed as substantially polycrystalline sapphire or amorphous aluminum oxide interfaces 51 between adjacent sapphire layers 50A-50D, or as adhesive or mechanically bonding interfaces 51. Various top and bottom coatings 52 and 54 may also be applied to cover glass 12, including optical, oleophobic, hydrophobic, and protective coatings, as described above.

Sapphire layers 50A-50D may also be doped or implanted with a range of different materials to provide desired physical properties, including, but not limited to, color, density, hardness, thermal or electrical conductivity and resistivity, and magnetic permeability or reluctance. In particular, any one or more of single-crystal sapphire layers 50A-50D may include one or more iron, titanium, chromium, copper, magnesium or other metal components, dopants, or impurities, in order to provide a desired tint or color cast, such as red, orange, yellow, green, blue, violet or purple, or a combination thereof. Where chromium impurities are present, for example, sapphire layers 50A-50D may also be referred to a ruby layers, and cover glass 12 may be referred to as a ruby glass or ruby cover glass component.

One or more pigmentation layers 55 may also be provided, for example as an internal pigmentation layer between any two sapphire layers 50A-50D, as shown in FIG. 7A, or as an external pigmented coating layer 52 or 53. Pigmentation layers 55 may be provided with a range of (e.g., substantially opaque) colored materials, for example red, yellow, blue, cyan, magenta, black and white, and combinations thereof, in order to shield internal components of the electronic device from external radiation (e.g., infrared sensors, cameras, and other light or radiation-sensitive components).

Where pigmentation layers 55 are provided as internal layers between two sapphire layers 50A-50D, scratching and abrasion are reduced during shipping, assembly and use. Internal pigmentation layers 55 may also include additional coating materials, for example adhesives and conducting or resistive materials, for example to provide electrical or capacitive coupling to a touch screen or other touch-sensitive device, or to provide shielding from radio frequency radiation.

Figure 7B:
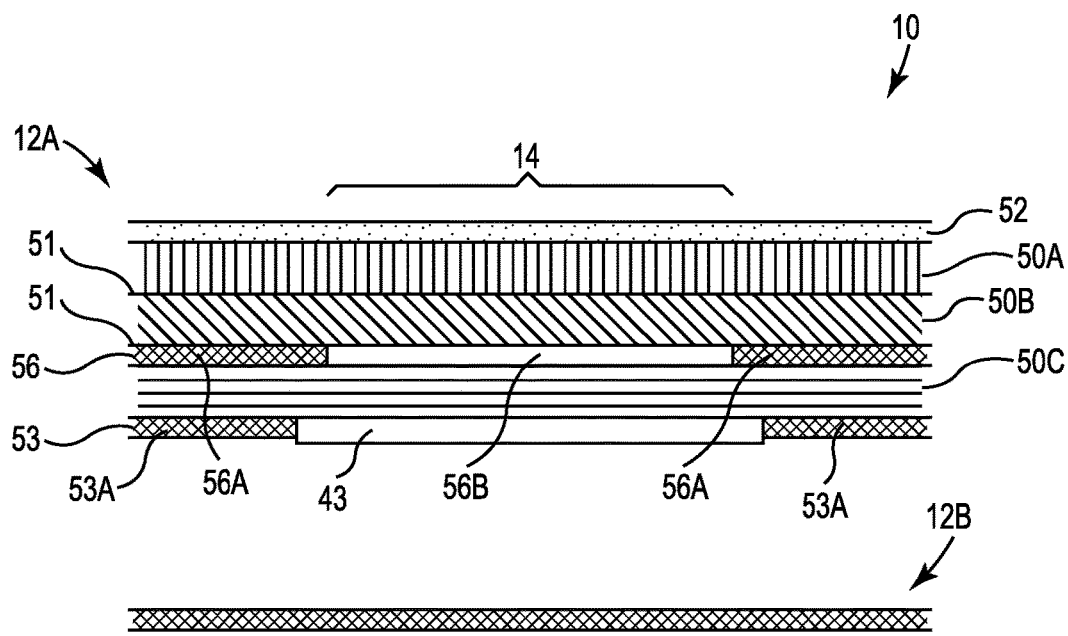
FIG. 7B is a cross-sectional view of the device and cover glass, illustrating a second alternate laminar structure.

FIG. 7B is a cross-sectional view of device 10 with front (or top) cover glass 12A and back (or bottom) cover glass 12B, illustrating an alternate laminar structure configured to define display window 14 for with display 43. In this configuration, cover glass 12 is formed of three or more substantially single-crystal sapphire or aluminum oxides layers 50A-50C separated by various interface layers 51, with or without additional surface coating layer 52 and 53, as described above.

In addition, cover glass 12 includes window layer 56 between one or more upper sapphire layers 50A-50B and one or more lower sapphire layers 50C. Window layer 56 is configured to provide display window area 14 for display 43, for example a touch-screen or touch-sensitive (interactive) display module, as described above.

Display window layer 56 includes side or border regions 56A and window or viewing region 56B. Side regions 56A may be substantially opaque, for example comprising substantially opaque pigmentation layers or deeply colored ruby or sapphire layers, as described above. Display window region 56B may be substantially transparent, for example a substantially transparent single-crystal sapphire or lightly tinted aluminum oxide material. Alternatively, window region 56B of display window layer 56 may be provides as a substantially uncoated region between borders 56B, or a clear coating region between borders 56B.

Generally, display window region 56B is configured to define to a substantially transparent display window 14 in cover glass 12A, with border portions 56A selected to define the viewing area of display 43. Alternatively, the geometry of border regions (or portions) 56A and window region (or portion) 56B may vary with respect to one or both of display window 14 and display 43, depending on the desired configuration of cover glass 12A. Display window 14 may also be defined by a bottom pigmented layer 53, with substantially opaque side regions 53A configured to accommodate the viewing area of display 43.

While this invention has been described with reference to exemplary embodiments, it will be understood by those skilled in the art that various changes may be made and equivalents may be substituted for elements thereof, without departing from the spirit and scope of the invention. In addition, modifications may be made to adapt the teachings of the invention to particular situations and materials, without departing from the essential scope thereof. Thus, the invention is not limited to the particular examples that are disclosed herein, but encompasses all embodiments falling within the scope of the appended claims.

I claim:

1. A cover glass for an electronic display, the cover glass comprising:
    a plurality of sapphire sheets directly bonded together by hydrogen bonds at a planar interface between adjacent sapphire sheets; and
    a display window defined in the cover glass, the display window configured for viewing the electronic display through the plurality of sheets of substantially single crystal sapphire; wherein
    each of the sapphire sheets has a substantially single crystal plane orientation; and
    adjacent sapphire sheets have different crystal plane orientations.

2. The cover glass of claim 1, wherein the adjacent sapphire sheets have substantially orthogonal crystal plane orientations.

3. The cover glass of claim 2, wherein the adjacent sapphire sheets comprise alternating A plane and C plane orientations.

4. The cover glass of claim 1, further comprising a metal component in one or more of the sapphire sheets, the metal component selected for one or more physical properties including color, hardness, and thermal or electrical conductivity and resistivity.

5. The cover glass of claim 1, further comprising a display window layer comprising substantially opaque window border portions and a substantially transparent window portion configured to define the display window in the cover glass.

6. The cover glass of claim 5, wherein the display window layer is provided between two of the plurality of sapphire sheets.

7. A device comprising:
    a display;
    a frame disposed about the display;
    a back cover coupled to a back of the frame and positioned behind the display;
    a front glass coupled to a front of the frame and positioned in front of the display, the front glass comprising a plurality of sapphire sheets directly bonded together by hydrogen bonds at a planar interface between adjacent sapphire sheets; wherein
    each of the sapphire sheets has a substantially single crystal plane orientation;
    the crystal plane orientations of adjacent sapphire sheets are different; and
    a substantially transparent display window is defined in the front glass for viewing the display through the plurality of sapphire sheets.

8. The device of claim 7, further comprising a display layer disposed between two of the plurality of sapphire sheets, the display layer comprising opaque border portions and a transparent window portion defining the display window in the front glass.

9. The device of claim 7, wherein the adjacent sapphire sheets have substantially orthogonal crystal plane orientations at the one or more planar interface layers.

10. The device of claim 7, wherein the back cover comprises a back cover glass formed by bonding two or more layers of substantially single crystal sapphire together across a planar interface, wherein the planar interface defines a transition between different crystal plane orientations in the two or more layers of substantially single crystal sapphire.

11. A cover glass for an electronic device having a display, the cover glass comprising:
- a first sapphire sheet having a first substantially single crystal plane orientation;
- a second sapphire sheet having a second substantially single crystal plane orientation, the second crystal plane orientation substantially orthogonal to the first crystal plane orientation;
- an interface layer defined between the first and second sapphire sheets, bonding the first and second sapphire sheets together at a planar interface by fusing non-single crystal aluminum oxide to the first and second sapphire sheets;
- a third sapphire sheet adjacent the second sapphire sheet; and
- a display window defined in part by an opening in a mask that is positioned between the second sapphire sheet and the third sapphire sheet, the display window configured for viewing the display through the first and second sapphire sheets bonded together across the interface layer.

12. The cover glass of claim 11, further comprising a display window layer adjacent the second sapphire sheet, the display window layer comprising substantially opaque side regions and a substantially transparent window region configured for viewing a viewable area of the display through the cover glass.

13. The cover glass of claim 11, wherein the first, second and third sapphire sheets each have a thickness of about 0.2 mm to about 0.4 mm, and wherein the cover glass has a thickness of 1.0 mm or less.

14. The cover glass of claim 1, wherein the crystal plane orientations of the plurality of sapphire sheets are selected for one or more physical properties, including at least one of hardness, durability, impact resistance, and scratch resistance.

15. The cover glass of claim 1, further comprising a coating over a surface of one of the plurality of sapphire sheets, the coating comprising at least one of an optical coating, a scratch coating, an abrasion coating, an anti-reflection coating, an anti-glare coating, a photochromatic coating, and an olephobic coating.

16. The cover glass of claim 2, wherein the adjacent sapphire sheets comprise alternating M plane and C plane orientations.

17. The device of claim 7, wherein at least a portion of the front glass is configured for capacitive touch-sensing across a surface of the front glass.

18. The device of claim 7, wherein the front glass is coupled to the frame by at least one of an adhesive layer and a mechanical attachment.

19. The cover glass of claim 11, wherein the interface layer is formed by heating the first and second sapphire sheets and the non-single crystal aluminum oxide to between 2000° C. and 2100° C. and placing the first and second sapphire sheets under compressive stress.

20. The cover glass of claim 11, wherein the first sapphire sheet comprises an A plane orientation and the second sapphire sheet comprises a C plane orientation.

* * * * *